United States Patent [19]

Potvin et al.

[11] Patent Number: 5,035,976

[45] Date of Patent: Jul. 30, 1991

[54] PHOTOSENSITIVE ARTICLE HAVING PHENOLIC PHOTOSENSITIZERS CONTAINING QUINONE DIAZIDE AND ACID HALIDE SUBSTITUENTS

[75] Inventors: Robert E. Potvin, West Warwick; Jonas O. St. Alban, Westerly; Chester J. Sobodacha, Coventry, all of R.I.

[73] Assignee: Hoechst Celanese Corporation, Somerville, N.J.

[21] Appl. No.: 431,342

[22] Filed: Nov. 3, 1989

Related U.S. Application Data

[62] Division of Ser. No. 170,538, Mar. 21, 1988, Pat. No. 4,902,785, which is a division of Ser. No. 859,284, May 2, 1986, Pat. No. 4,732,836.

[51] Int. Cl.$^5$ ................................................. G03C 1/54
[52] U.S. Cl. ...................................... 430/165; 430/166; 430/192; 430/193; 430/303; 534/557
[58] Field of Search ................. 534/557; 430/165, 192, 430/166, 193, 303

[56] References Cited

U.S. PATENT DOCUMENTS

| | | | |
|---|---|---|---|
| 3,046,115 | 7/1962 | Schmidt et al. | 534/557 X |
| 3,046,118 | 7/1962 | Schmidt et al. | 534/557 X |
| 3,046,119 | 7/1962 | Sus et al. | 534/557 X |
| 3,106,465 | 10/1963 | Neugebauer et al. | 534/567 X |
| 3,148,983 | 9/1964 | Endermann et al. | 534/557 X |
| 3,635,709 | 1/1972 | Kobayashi | 534/557 X |
| 3,647,443 | 1/1972 | Rauner et al. | 534/557 X |
| 3,666,473 | 5/1972 | Colom et al. | 534/557 X |
| 3,859,099 | 1/1975 | Petropoulos et al. | 534/557 X |
| 3,890,152 | 6/1975 | Ruckert et al. | 534/557 X |
| 3,902,906 | 9/1975 | Iwama et al. | 534/557 X |
| 3,984,250 | 10/1976 | Holstead et al. | 534/557 X |
| 4,024,122 | 5/1977 | Ross et al. | 534/557 X |
| 4,173,470 | 11/1979 | Fahrenholtz et al. | 534/557 X |
| 4,308,368 | 12/1981 | Kubo et al. | 534/557 X |
| 4,397,937 | 8/1983 | Clecak et al. | 534/557 X |
| 4,407,926 | 10/1983 | Stahlhofen | 534/557 X |
| 4,439,511 | 3/1984 | Stahlhofen | 534/557 X |
| 4,458,000 | 7/1984 | Stahlhofen | 534/557 X |
| 4,499,171 | 2/1985 | Hosaka et al. | 534/557 X |
| 4,526,856 | 7/1985 | Lewis et al. | 534/557 X |
| 4,550,069 | 10/1985 | Pampalone | 534/557 X |
| 4,555,469 | 11/1985 | Erdmann et al. | 534/557 X |
| 4,564,575 | 1/1986 | Perreault | 534/557 X |
| 4,576,901 | 3/1986 | Stahlhofen et al. | 534/557 X |
| 4,632,900 | 12/1986 | Demmer et al. | 534/557 X |
| 4,839,256 | 6/1989 | Muller | 430/192 |

FOREIGN PATENT DOCUMENTS

| | | | |
|---|---|---|---|
| 2211677 | 7/1974 | France | 534/557 |
| 57-150944 | 9/1982 | Japan | 534/557 |
| 58-75149 | 5/1983 | Japan | 534/557 |
| 60-133446 | 7/1985 | Japan | 534/557 |
| 60-138544 | 7/1985 | Japan | 534/557 |

OTHER PUBLICATIONS

"Organic Chemistry", Ronald F. Brown, 1975, Wadsworth Publishing Company, Belmont, Calif., p. 78.
"Chemistry of Organic Compounds", Carl R. Noller, 1965, W. B. Saunders Company, p. 795, 800, 801, 805.
"Condensed Chemical Dictionary", 5th Edition, 1956, Reinhold Publishing Company, New York, p. 837.

Primary Examiner—Mary C. Lee
Assistant Examiner—Fiona T. Powers
Attorney, Agent, or Firm—Richard S. Roberts

[57] ABSTRACT

The invention relates to new mixed ester photosensitive compounds and photosensitizer compositions comprised thereof. The photosensitive compounds and photosensitizer compositions are prepared by condensing phenolic compounds with a 1,2-naphthoquinonediazide-4-sulfonic acid halide and an organic acid halide in specific ratios. Photoresist compositions comprising the photosensitive compounds and photosensitizer compositions are also disclosed. The photosensitiizer compositions exhibit excellent solution stability and resistance to precipitation when formulated in alkali-soluble resin photoresist compositions. The photoresist compositions have improved shelf life.

18 Claims, No Drawings

PHOTOSENSITIVE ARTICLE HAVING PHENOLIC PHOTOSENSITIZERS CONTAINING QUINONE DIAZIDE AND ACID HALIDE SUBSTITUENTS

This application is a divisional of Ser. No. 07/170,538 filed on Mar. 21, 1988, now U.S. Pat. No. 4,902,785 which was a divisional of Ser. No. 06/859,284 filed on May 2, 1986, now U.S. Pat. No. 4,732,836.

BACKGROUND OF THE INVENTION

The present invention relates generally to photosensitive compositions and radiation sensitive positive photoresist compositions and particularly to compositions containing novolak and polyvinyl phenol resins together with naphthoquinone diazide sensitizing agents.

It is well known in the art to produce positive photoresist formulations such as those described in U.S. Pat. Nos. 3,666,473, 4,115,128, 4,173,470 and 4,550,069. These include alkali-soluble novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The novolak or polyvinyl phenyl resin component of these photoresist formulations is soluble in aqueous alkaline solutions, but the naphthoquinone sensitizer acts as a dissolution rate inhibitor with respect to the resin. Upon exposure of selected areas of the coated substrate to actinic radiation, however, the sensitizer undergoes a radiation induced structural transformation and the exposed areas of the coating are rendered more soluble than the unexposed areas. This difference in solubility rates causes the exposed areas of the photoresist coating to be dissolved when the substrate is immersed in alkaline developing solution while the unexposed areas are largely unaffected, thus producing a positive relief pattern on the substrate.

In most instances, the exposed and developed substrate will be subjected to treatment by a substrate-etchant solution. The photoresist coating protects the coated areas of the substrate from the etchant and thus the etchant is only able to etch the uncoated areas of the substrate, which in the case of a positive photoresist, correspond to the areas that were exposed to actinic radiation. Thus, an etched pattern can be created on the substrate which corresponds to the pattern of the mask, stencil, template, etc., that was used to create selective exposure patterns on the coated substrate prior to development.

The relief pattern of photoresist on substrate produced by the method described above is useful for various applications including, for example, as an exposure mask or a pattern such as is employed in the manufacture of miniaturized integrated electronic components.

The properties of a photoresist composition which are important in commercial practice include the photospeed of the resist, development contrast, resist resolution, and resist adhesion.

Photospeed is important for a photoresist, particularly in applications where a number of exposures are needed, for example, in generating multiple patterns by a repeated process, or where light of reduced intensity is employed such as in projection exposure techniques where the light is passed through a series of lenses and mono-chromatic filters. Thus, increased photospeed is particularly important for a resist composition employed in processes where a number of multiple exposures must be made to produce a mask or series of circuit patterns on a substrate.

Development contrast refers to a comparison between the percentage of film loss in the exposed area of development with the percentage of film loss on the unexposed area. Ordinarily, development of an exposed resist coated substrate is continued until the coating on the exposed area is substantially completely dissolved away and thus, development contrast can be determined simply by measuring the percentage of the film coating loss in the unexposed areas when the exposed coating areas are removed entirely.

Resist resolution refers to the capability of a resist system to reproduce the smallest equally spaced line pairs and intervening spaces of a mask which is utilized during exposure with a high degree of image edge acuity in the developed exposed spaces.

In many industrial applications, particularly in the manufacture of miniaturized electronic components, a photoresist is required to provide a high degree of resolution for very small line and space widths (on the order of one micron or less).

The ability of a resist to reproduce very small dimensions, on the order of a micron or less, is extremely important in the production of large scale integrated circuits on silicon chips and similar components. Circuit density on such a chip can only be increased, assuming photolithography techniques are utilized, by increasing the resolution capabilities of the resist.

In order to achieve the desired sensitivity and contrast, it is necessary to have a sufficiently high concentration of photosensitive compounds in the photoresist to prevent dissolution of the unexposed resist during development. High concentrations photosensitizer may be achieved by dissolving a mixture of highly soluble and less soluble photosensitizers in the photoresist solution or by supersaturating the photoresist solution with a photosensitizer.

However, solution concentration of photosensitizer near saturation can lead to a short shelf life due to solution instability and precipitation of the sensitizer prior to or during the use of the product. This phenomenon is referred to in U.S. Pat. Nos. 4,397,937 and 4,526,856, both of which are hereby incorporated by reference.

An important group of photosensitizers are the condensation products of 1,2-naphthoquinonediazide-4-sulfonic acid and aromatic diols and polyols. These compounds tend to exhibit superior photospeed and contrast in the mid-UV region of the light spectrum when formulated in photoresist compositions. However, these photosensitizers also tend to have low solubility and solution stability.

Clecak et al. in U.S. Pat. No. 4,397,937 discloses improved solubility by using as a sensitizer a biester of 1-oxo-2-diazonaphthalene sulfonic acid and an unsymmetrical primary or secondary aliphatic diol which is a mixture of geometric and diastereoisomers. Esterification of the aliphatic diol at one end with a diazonaphthoquinone molecule having the acid group in the 5 position and at the other end with a diazonophthoquinone molecule having the sulfonyl group in the 4 position is disclosed. However, the patent emphasizes the importance of limiting the invention to unsymmetrical aliphatic diols. Clecak et al. does not disclose mixed esters of o-quinone diazide acids and non-light-sensitive organic acids.

According to Lewis et al. in U.S. Patent 4,526,856, the problem of obtaining higher concentrations of sensitizer was addressed by modifying the solvent system of the photoresist formulations. The solvent composition which consists of cyclopentanone, or cyclopentanone and cyclohexanone with an aliphatic alcohol, when used in certain critical ratios provides good solubility.

In contrast, the present invention provides photosensitizers which are the condensation products of 1,2 naphthoquinonediazide-4-sulfonic acid and organic acids with aromatic diols and polyols. The photosensitizer compositions of the invention exhibit excellent solubility and resistance to precipitation when formulated in photoresist compositions. Also they may be dissolved into photoresist compositions at higher solution concentrations than previously known comparable photosensitizers. The photoresist compositions of the invention exhibit excellent solution stability and an improved shelf life. At the same time they retain photosensitivity and contrast properties comparable to the best formulations heretofore available.

SUMMARY OF THE INVENTION

The invention relates to new mixed ester photosensitive compounds and photosensitizer compositions comprised thereof. The photosensitive compounds and photosensitizer compositions are prepared by condensing phenolic compounds with a 1,2-naphthoquinonediazide-4-sulfonic acid halide and an organic acid halide in specific ratios. Photoresist compositions comprising the photosensitive compounds and photosensitizer compositions are also disclosed. The photosensitizer compositions exhibit excellent solution stability and resistance to precipitation when formulated in alkali-soluble resin photoresist compositions. The photoresist compositions have improved shelf life.

According to the present invention there is provided: photosensitive compounds represented by the general formulae (1), (2) or (3):

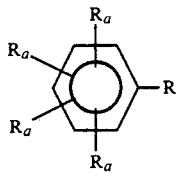
(1)

wherein R is H, —X—$R_b$ or

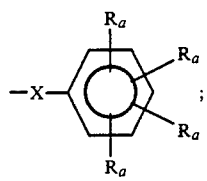
;

X is a single C—C bond, —O—, —S—, —$SO_2$—,

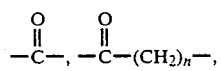

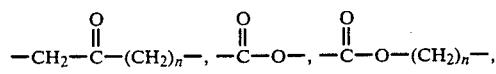

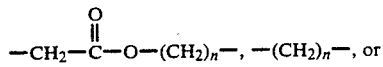

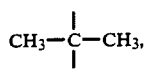

$n$ is 1 or 2, $R_a$ is H, —OH, —OY, —OZ, halogen or lower alkyl, with at least one $R_a$ radical being —OY and at least one thereof being —OZ, $R_b$ is H, alkyl, aryl, substituted alkyl, or substituted aryl;

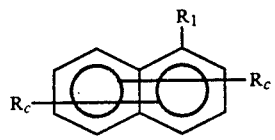
(2)

wherein $R_1$ is H, or

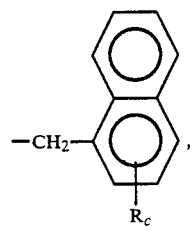
, $R_c$ is H, —Oh, —OY or —OZ, with at least one $R_c$ radical being —OY and at least one thereof being —OZ; and

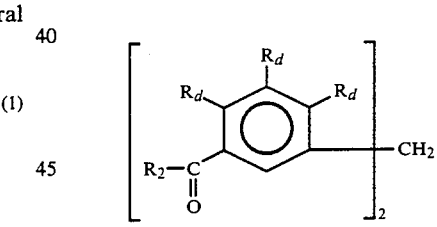
(3)

wherein $R_2$ is H, alkyl, arYl, substituted alkYl, or substituted aryl, $R_d$ is —OH, —OY or —OZ with at least one $R_d$ radical being —OY and at least one thereof being —OZ;

wherein Y is 1,2-naphthoquinonediazide-4-sulfonyl and Z is —W—$R_3$, where W is

or —$SO_2$—, and $R_3$ is alkyl, aryl, substituted alkyl or substituted aryl.

According to the present invention there is provided: a photosensitizer composition comprising the condensation product of:

(I) a phenolic compound selected from the group consisting of:

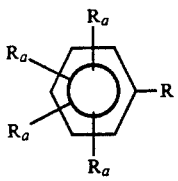

wherein R is H, —X—$R_b$, or

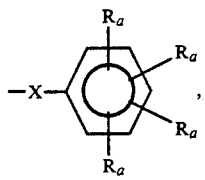

$R_a$ is H, —OH, halogen or lower alkyl, with at least two and not greater than six $R_a$ radicals being —OH, X is a single C—C bond, —O—, —S—, —$SO_2$—,

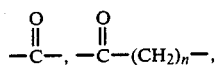

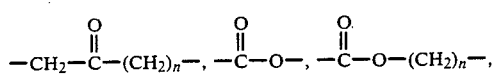

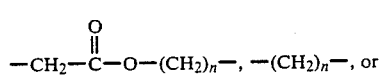

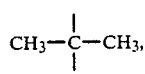

n is 1 or 2, $R_b$ is H, alkyl, aryl, substituted alkyl or substituted aryl;

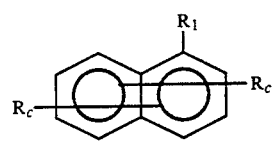

wherein $R_1$ is H or ,

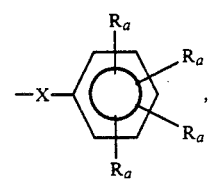

$R_c$ is H or —OH with at least two $R_c$ radicals being —OH; and

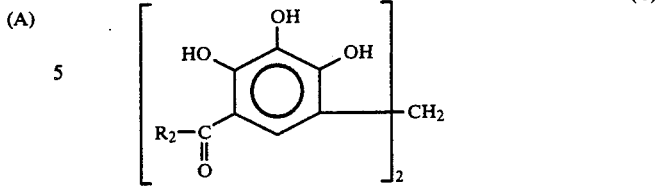

wherein $R_2$ is H, alkyl, aryl, substituted alkyl, or substituted aryl;

(II) a 1,2-naphthoquinonediazide-4-sulfonic acid (Diazo); and (III) an organic acid halide represented by the formula:

W—$R_3$ wherein W is

or —$SO_2$13 V, V is halogen, $R_3$ is alkyl, aryl, substituted alkyl or substituted aryl;

wherein the molar ratio of the amount of Diazo reacted to the amount of organic acid reacted is in the range of from about 1:1 to about 39:1.

According to the present invention there is provided: a process for preparing a photosensitizer composition comprising: condensing a phenolic compound represented by the general formulae (A), (B) or (C):

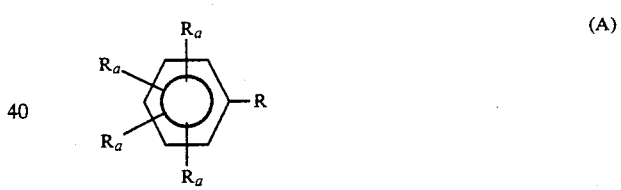

wherein R is H, —X—$R_b$, or

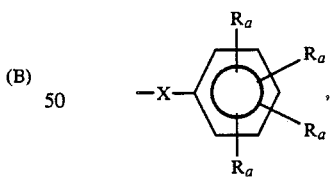

$R_a$ is H, —OH, halogen or lower alkyl, with at least two and not greater than six $R_a$ radicals being —OH, X is a single C—C bond, —O—, —S—, —$SO_2$—,

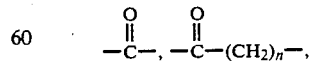

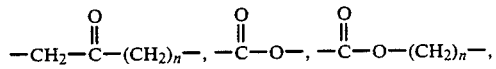

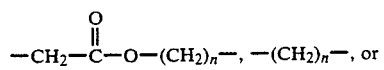

-continued

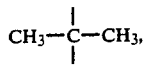

n is 1 or 2, $R_b$ is H, alkyl, aryl, substituted alkyl or substituted aryl;

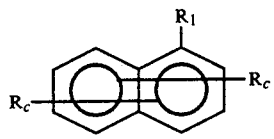 (B)

wherein $R_1$ is H or

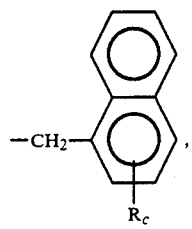, $R_c$ is H or —Oh with at least two $R_c$ radicals being —OH; and

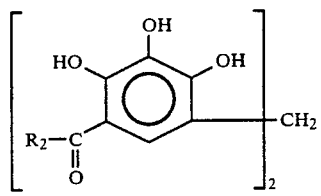 (C)

wherein $R_2$ is H, alkyl, aryl, substituted alkyl, or substituted aryl; with a 1,2-napthoquinonediazide-4-sulfonic acid (Diazo) and with an organic acid halide represented by the formula W—$R_3$, wherein W is

or —$SO_2$—V, V is halogen, $R_3$ is alkyl, aryl, substituted alkyl or substituted aryl; wherein the molar ratio of the amount of Diazo to the amount of organic acid halide to be reacted is in the range of from about 1:1 to about 39:1.

According to the present invention there is provided: a photoresist composition comprising in admixture a novolak or polyvinyl phenol resin, a photosensitive compound as described above, and a solvent.

According to the present invention there is provided: a photoresist composition comprising in admixture a novolak or polyvinyl phenol resin, a photosensitizer composition as described above, and a solvent.

According to the present invention there is provided: a method for producing an article which comprises coating a photoresist composition as described above onto a substrate; imagewise exposing said composition to sufficient ultraviolet radiation to render said imagewise exposed portions substantially soluble in an aqueous alkaline solution; and then removing the thusly exposed composition portions from said substrate with an aqueous alkaline developing solution.

DETAILED DESCRIPTION OF PREFERRED EMBODIMENTS

The present invention overcomes problems of sensitizer precipitation, solution instability and short shelf life of photoresist formulations by chemically modifying the photosensitizer component of the photoresist compositions. It has been found that by substituting an organic acid for a portion of the 1,2-naphthoquinonediazide-4-sulfonyl groups (Diazo) in photosensitizer compositions consisting essentially of 1,2-naphthoquinonediazide-4-sulfonyl esters of phenolic compounds, novel mixed ester photosensitive compounds and photosensitizer compositions may be obtained. These Diazo/organic acid mixed esters and photosensitizer compositions thereof may be formulated in positive-acting alkali-soluble novolak or polyvinyl phenol resin photoresist compositions which exhibit improved shelf life and solution stability while maintaining photosensitivity and development contrast properties comparable to photoresist compositions formulated with photosensitizer compositions of unmodified Diazo esters.

The photosensitive compounds and photosensitizer compositions may be obtained by condensing phenolic compounds with a mixture of Diazo and organic acid halides. The molar ratio of the amount of Diazo to the amount of organic acid halide in the mixture may be in the range of from about 1:1 to about 39:1, preferably from about 4:1 to about 19:1, or more preferably from about 93:7 to about 85:15. For example, one mole of 2,3,4-trihydroxybenzophenone may be condensed with a 9:1 mixture of 2.7 moles of Diazo and 0.3 moles of methanesulfonyl chloride to yield a photosensitizer composition comprising compounds having the formula:

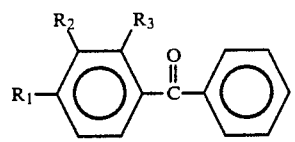

where $R_1$, $R_2$ and $R_3$ may independently be either 1,2-naphthoquinonediazide-4-sulfonyl (Diazo) or methanesulfonyl.

Thus, in one aspect, the invention provides photosensitive compounds useful in photosensitizer compositions. The photosensitive compounds may be represented by general formulae (1), (2) and (3):

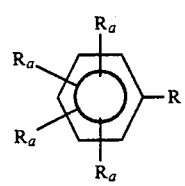 (1)

wherein R is H, —X—$R_b$ or

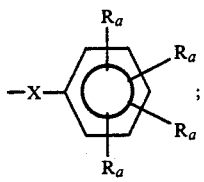

X is a single C—C bond, —O—, —S—, —SO$_2$—,

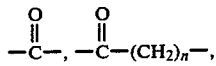

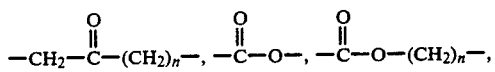

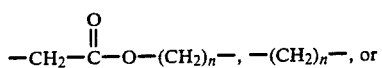

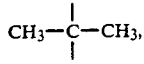

n is 1 or 2, $R_a$ is H, —OH, —OY, —OZ, halogen, preferably Cl or Br, or lower alkyl, preferably lower alkyl having 1-4 carbon atoms, with at least one $R_a$ radical being —OY and at least one thereof being —OZ, $R_b$ is H, alkyl, aryl, substituted alkyl, or substituted aryl; preferably alkyl having 1-20 carbon atoms, more preferably 1-12 carbon atoms, preferably aryl being phenyl or naphthyl, alkyl or aryl may be substituted with lower alkyl having 1-4 carbon atoms, lower alkoxy having 1-4 carbon atoms, or halogen atoms, preferably Cl or Br;

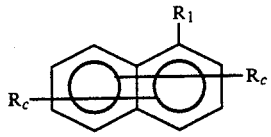 (2)

wherein $R_1$ is H, or

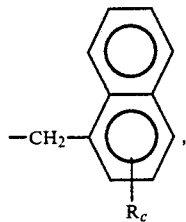

$R_c$ is H, —OH, —OY or —OZ, with at least one $R_c$ radical being —OY and at least one thereof being —OZ; and

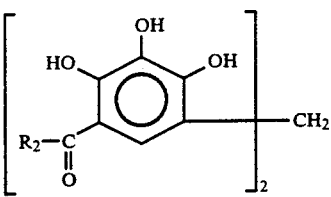 (3)

wherein $R_2$ is H, alkyl, aryl, substituted alkyl, or substituted aryl, $R_d$ is —OH, —OY or —OZ with at least one $R_d$ radical being —OY and at least one thereof being —OZ; the alkyl radicals $R_2$ may be straight-chain or branched and may be substituted with halogen atoms or lower alkoxy groups having 1-4 carbon atoms, preferably the alkyl radicals have 1-20 carbon atoms; the aryl radicals $R_2$ are preferably mononuclear and may be substituted with lower alkyl or alkoxy groups having 1-4 carbon atoms or with halogen atoms, preferably the aryl radicals have 1 to 10 carbon atoms; compounds in which $R_2$ is an aryl radical are particularly preferred and compounds in which the aryl radical is a phenyl radical are especially preferred;

wherein Y is 1,2-naphthoquinonediazide-4-sulfonyl and Z is —W—$R_3$, where W is

or —SO$_2$—, and $R_3$ is alkyl, aryl, substituted alkyl or substituted aryl; the alkyl radicals $R_3$ may be straight-chain or branched and may be substituted with halogen atoms, preferably Br or Cl, or lower alkoxy groups having 1-4 carbon atoms, preferably alkyl having 1-20 carbon atoms; the aryl radicals $R_3$ are preferably mononuclear and may be substituted with lower alkyl or alkoxy groups having 1-4 carbon atoms or with halogen atoms, preferably Br or Cl, preferably aryl radicals having 6-10 carbon atoms; phenyl radicals are preferred; alkyl radicals are particularly preferred and lower alkyl radicals having 1-6 carbon atoms are especially preferred.

These photosensitive compounds may be prepared, for example, in the manner as herein described for the preparation of the photosensitizer compositions. The compounds may be isolated and purified as desired.

Another aspect of the invention provides photosensitizer compositions comprising inter alia the photosensitive compounds disclosed herein. The photosensitizer compositions may be obtained by condensing phenolic compounds with a mixture of Diazo and organic acid halides. The Diazo component and the organic acid halide component of the mixture may be condensed either sequentially or concurrently with the phenolic compounds.

The Diazo/organic acid mixture may be reacted preferably in stoichiometric quantities with the hydroxyl-bearing compounds. However, the phenolic compounds need not be completely esterified and less than stoichiometric quantities of the Diazo and organic acid halide compounds may be condensed with the phenolic compounds provided that the molar ratio of Diazo to organic acid halide reacted is within the ranges specified herein. The total amount of Diazo and organic acid halide reacted with the phenolic compounds should be sufficient to produce a photosensitizer composition capable of inhibiting the dissolution rate of an alkali-soluble resin.

The phenolic compounds which may be condensed with the Diazo/organic acid mixture are represented by the general formulae (A), (B) and (C):

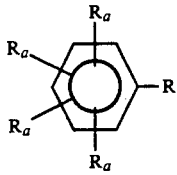 (A)

wherein R is —H, —OH, —X—$R_b$, or

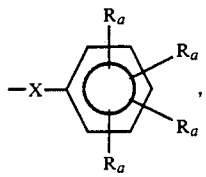, $R_a$ is H, —OH, halogen, preferably Cl or Br, or lower alkyl, preferably lower alkyl having 1 to 4 carbon atoms; with at least two and not greater than six $R_a$ radicals being —OH, X is a single C—C bond, —O—, —S—, —$SO_2$—,

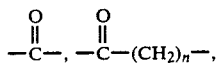

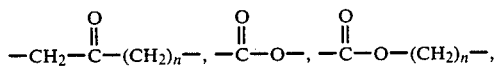

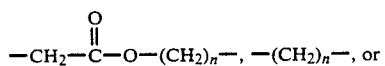

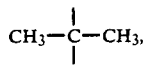, or $$CH_3-\underset{|}{\overset{|}{C}}-CH_3,$$

n is 1 or 2, $R_b$ is H, alkyl, aryl, substituted alkyl or substituted aryl; preferably alkyl having 1–20 carbon atoms, more preferably 1–12 carbon atoms, preferably aryl being phenyl or naphthyl, alkyl or aryl may be substituted with lower alkyl having 1–4 carbon atoms, lower alkoxy having 1–4 carbon atoms, or halogen atoms, preferably Cl or Br;

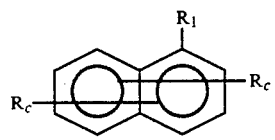 (B)

wherein $R_1$ is H or

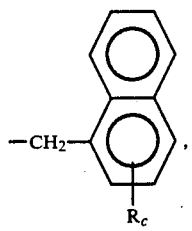, $R_c$ is H or —OH with at least two $R_c$ radicals being —OH; and

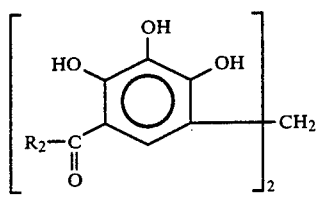 (C)

wherein $R_2$ is H, alkyl, aryl, substituted alkyl, or substituted aryl; the alkyl radicals $R_2$ may be straight-chain or branched and may be substituted with halogen atoms or lower alkoxy groups having 1–4 carbon atoms, preferably the alkyl radicals have 1–20 carbon atoms; the aryl radicals $R_2$ are preferably mononuclear and may be substituted with lower alkyl or alkoxy groups having 1–4 carbon atoms or with halogen atoms, preferably the aryl radicals have 1 to 10 carbon atoms; compounds in which $R_2$ is an aryl radical are particularly preferred and compounds in which the aryl radical is a phenyl radical are especially preferred.

Among the phenolic compounds represented by the general formula (I) are: hydroxyl-bearing benzene compounds such a 1,2-dihydroxybenzene, 1,3-dihydroxybenzene, 1,4-dihydroxybenzene, 1,2,3-trihydroxybenzene, 1,2,4-trihydroxybenzene, 1,3,5-trihydroxybenzene, and the like; dihydroxybenzophenones such as 2,2'-dihydroxybenzophenone, 2,3'-dihydroxybenzophenone, 2,4-dihydroxybenzophenone, 2,4'-dihydroxybenzophenone, 2,5-dihydroxybenzophenone, 3,3'-dihydroxybenzophenone, 4,4'-dihydroxybenzophenone, and the like; trihydroxybenzophenones such as 2,2',6-trihydroxybenzophenone, 2,3,4-trihydroxybenzophenone, 2,4,4'-trihydroxybenzophenone, 2,4,6-trihydroxybenzophenone, 3,4,5-trihydroxybenzophenone, and the like; tetrahydroxybenzophenones such as 2,2',3,4-tetrahydroxybenzophenone, 2,2', 4,4'-tetrahydroxybenzophenone, 2,2', 4,6'-tetrahydroxybenzophenone, 2,2',5,6'-tetrahydroxybenzophenone, 2,3',4,4'-tetrahydroxybenzophenone, 2,3',4,6-tetrahydroxybenzophenone, 2,4,4',6-tetrahydroxybenzophenone, 3,3',4,4',-tetrahydroxybenzophenone, and the like; pentahydroxybenzophenones; hexahydroxybenzophenones; dihydroxy- and trihydroxy- phenyl alkyl ketones such as 2,4-dihydroxyphenyl alkyl ketones, 2,5-dihydroxyphenyl alkyl ketones, 3,4-dihydroxyphenyl alkyl ketones, 3,5-dihydroxyphenyl alkyl ketones, 2,3,4-trihydroxyphenyl alkyl ketones, 3,4,5-trihydroxyphenyl alkyl ketones, 2,4,6-trihydroxyphenyl alkyl ketones, and the like, preferably alkyl having 1–12 carbon atoms such as methyl, ethyl, butyl, n-hexyl, heptyl, decyl, dodecyl, and the like; dihydroxyphenyl aralkyl ketones; trihydroxyphenyl aralkyl ketones; dihydroxydiphenyls; trihydroxydiphenyls such as 2,2',4-trihydroxydiphenyl;

tetrahydroxydiphenyls such as 2,2',4,4'-tetrahydroxydiphenyl; dihydroxydiphenyl oxides; dihydroxydibenzyl oxides; dihydroxydiphenyl alkanes, preferably lower alkanes such as methane, ethane, propane or the like; dihydroxybenzoic acid; trihydroxybenzoic acids; dihydroxy- and trihydroxy- benzoic acid alkyl esters, alkyl preferably having 1 to 12 carbon atoms, such as n-butyl 2,4-, 2,5-, 3,4- and 3,5-dihydroxybenzoate, 2,4,4-trimethylpentyl 2,4-dihydroxybenzoate, and the like; dihydroxy- and trihydroxy- benzoic acid phenyl esters; dihydroxy-, trihydroxy-, and tetrahydroxy- diphenyl sulfides such as 4,4'dihydroxydiphenyl sulfide; dihydroxydiphenyl sulfones; and dihydroxy- and trihydroxy- phenyl naphthyl ketones such as 2,3,4-trihydroxyphenyl naphthyl ketone; and the like.

Examples of compounds of general formula (I) where at least one $R_a$ radical is halogen or lower alkyl include 2,4-dihydroxy-3,5-dibromobenzophenone; 5-bromo-2,4-dihydroxybenzoic acid and esters; 2,4,2',4'-tetrahydroxy-3,5,3',5'-tetrabromodiphenyl; 4,4'-dihydroxy-2,2'dimethyl-5,5'-di-tert.-butyl diphenyl; 4,4'-dihydroxy-2,2'dimethyl-5,5'-di-tert.-butyl diphenyl sulfide; 2,4,2',4'-tetrahydroxy-3,5,3'5'-tetrabromodiphenyl sulfone; and the like.

The preferred class of phenolic compounds of general formula (I) are the hydroxyl-bearing benzophenones and the especially preferred compounds are the trihydroxybenzophenones.

Among the phenolic compounds represented by general formula (II) are: dihydroxynaphthalenes such as 1,2-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene, 2,7-dihydroxynaphthalene, and the like; dihydroxydinaphthylmethanes such as 2,2'dihydroxydinaphthylmethane, and the like. The dihydroxynaphthylenes are preferred. The hydroxyl groups of the dihydroxynaphthylenes may be either on the same nucleus or on different nucleii of the naphthalene moiety.

Among the phenolic compounds represented by general formula (III) are bis-(3-benzoyl-4,5,6-trihydroxyphenyl)-methane; bis-(3-acetyl-4,5,6-trihydroxyphenyl)-methane; bis-(3-propionyl-4,5,6-trihydroxyphenyl)-methane; bis-(3-butyryl-4,5,6-trihydroxyphenyl)-methane; bis-(3-hexanoyl-4,5,6-trihydroxyphenyl)-methane; bis-(3-heptanoyl-4,5,6-trihydroxyphenyl)-methane; bis-(3-decanoyl-4,5,6-trihydroxyphenyl)-methane; bis-(3-octadecanoyl-4,5,6-trihydroxyphenyl)-methane; and the like.

The organic acid halides which may be used to modify the Diazo ester compounds may be represented by the formula:

W—R$_3$ wherein W is

or —SO$_2$—V, V is halogen, preferably Cl or Br, and R$_3$ is alkyl, aryl, substituted alkyl or substituted aryl; the alkyl radicals R$_3$ may be straight-chain or branched and may be substituted with halogen atoms, preferably Br or Cl, or lower alkoxy groups having 1-4 carbon atoms, preferably the alkyl radicals have 1-20 carbon atoms; the aryl radicals R$_3$ are preferably mononuclear and may be substituted with lower alkyl or alkoxy groups having 1-4 carbon atoms or with halogen atoms, preferably Br or Cl, preferably the aryl radicals have 6 to 10 carbon atoms, phenyl radicals are especially preferred; compounds in which R$_3$ is an alkyl radical are particularly preferred and compounds in which the alkyl radical is lower alkyl radical having 1-6 carbon atoms are especially preferred.

Among the organic acid halides represented by the above formula are alkyl sulfonyl halides such as methanesulfonyl chloride, ethanesulfonyl chloride, propanesulfonyl chloride, n-butanesulfonyl chloride, dodecanesulfonyl chloride, and the like; arylsulfonyl chlorides such as benzenesulfonyl chloride, naphthalenesulfonyl chlorides, and the like; acyl halides such as acetyl chloride, butanoyl chloride, valeryl chloride, benzoyl chloride, benzoyl bromide, naphthoyl chlorides, and the like. The preferred organic acid halides are lower alkyl sulfonyl halides and lower alkyl acyl halides having 1-6 carbon atoms, and benzenesulfonyl halides and benzoyl halides. These acid halides may be substituted or unsubstituted.

The following examples are presented solely to illustrate the invention and should not be considered to constitute limitations on the invention, many variations of which are possible without departing from the spirit or scope thereof.

Preparation of Photosensitizer Compositions

The preparation of naphthoquinonediazide photosensitizers is described in U.S. Pat. Nos. 3,046,118, 3,106,645 and 4,397,937, which are hereby incorporated by reference. The photosensitizer compositions of this invention may be obtained by condensing the desired naphthoquinonediazide sulfonyl halide and organic acid halide with a phenolic compound which has more than one hydroxyl group in the presence of an acid scavenger. The resulting sensitizer composition may be purified as desired.

Solvents for the reaction may include, but are not limited to, acetone, p-dioxane, tetrahydrofuran, methylene chloride, pyridine, or the like.

The acid scavenger may be inorganic, such as sodium carbonate, or the like, or organic, such as sodium salts of weak acids, tertiary amines such as triethyl amine, pyridines, or the like.

EXAMPLE 1

A ten mole percent methanesulfonyl-modified 2,3,4-trihydroxybenzo-phenone-1,2-naphthoquinonediazide-4-sulfonic acid triest prepared. 23.0 grams of 2,3,4-trihydroxybenzophenone and 72.6 grams of 1,2-naphthoquinonediazide-4-sulfonyl chloride (Diazo) are stirred together in 350ml acetone. 3.6 grams of methanesulfonyl chloride are added in. 36.4 grams of triethylamine are slowly dropped in while maintaining an internal temperature of about 30° C. The reaction mixture is cooled to ≦15° C., treated with charcoal and diatomaceous earth, filtered, washed with 350 ml acetone, and drowned in 3.5 liters of 1 normal hydrochloric acid. The product is filtered off, washed with water, and dried in an air oven at ≦40° C. The yield obtained is 85.9 grams, 97.5% of theory.

The product thusly obtained may be purified as desired.

The method of synthesis shown in this example is not the only way to make such photosensitizer compositions, as those skilled in the art may obtain comparable products by simply varying solvents, bases or reaction conditions. Several other examples were prepared according to the above method at various molar ratios of Diazo to organic acid halide and are set forth in Tables 1 and 2.

COMPARATIVE EXAMPLES

Several comparative examples are prepared by condensing 2,3,4-trihydroxybenzophenone with 1,2-naphthoquinonediazide-4-sulfonyl chloride in a molar ratio of 1 to 3.

PREPARATION OF POSITIVE PHOTORESIST SYSTEMS

The photoresist composition may be prepared by formulating the photosensitizer compositions of this invention with alkali-soluble resins, solvents and, if desired, other additives. Alkali-soluble resins which may be used include, for example, novolak resins, polyvinyl phenol resins, and the like.

Alkali-soluble novolak resins, which may be used for preparing photosensitive compositions, are known in the art. A procedure for their manufacture is described in *Chemistry and Application of Phenolic Resins*, Knop, A. and Scheib, W.; Springer Verlag, N.Y., 1979 in Chapter 4 which is incorporated herein by reference.

The photoresist compositions of this invention are prepared by dissolving the above-mentioned novolak or polyvinyl phenol resins and the photosensitizer compositions of the invention in a solvent. Suitable solvents for this purpose include, for example, propylene glycol methyl ether acetate and the like; glycol ethers such as ethylene glycol monomethyl ether, ethylene glycol monoethyl ether and the like; cellosolve acetates such as methyl cellosolve acetate, ethyl cellosolve acetate and the like; esters such as ethyl acetate, butyl acetate and the like; ketones such as methyl ethyl ketone, cyclopentanone, cyclohexanone and the like; and aromatic hydrocarbons such as toluene, xylene and the like. It is also possible to use mixtures thereof. The choice of solvent, or mixture of solvents, will depend upon the coating method intended, layer thickness, drying conditions and consideration of the solubilities of the constituents, vaporization speed of solvent after coating the photoresist composition on a substrate, and the like.

Optionally, additives such as colorants, dyes, antistriation agents, plasticizers, adhesion promoters, speed enhancers and such surfactants as non-ionic surfactants may be added to the photoresist composition before it is coated onto a substrate.

In the preferred embodiments, the solid parts of the photoresist compositions, that is the novolak or polyvinyl phenol resin and photosensitizer composition, preferably ranges from 15% to about 99% novolak or polyvinyl phenol binder resin and from about 1% to about 85% photosensitizer composition. A more preferred range of binder resin would be from about 50% to about 97% and most preferably from about 65% to about 93% by weight of the solid resist parts. A more preferred range of photosensitizer composition would be from about 3% to about 50% and most preferably from about 7% to about 35% by weight of the solid resist parts. In preparing the resist composition the binder resin and photosensitizer composition are mixed with the solvent such that the solvent is present in an amount of from about 40% to about 90% by weight of the overall resist composition. A more preferred range is from about 60% to about 85% and most preferably from about 65% to about 80% by weight of the overall resist composition.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used up to five percent weight level, based on the combined weight of novolak and sensitizer.

Plasticizers which may be used include, for example, phosphoric acid tri-($\beta$-chloroethyl)-ester; stearic acid; dicamphor; polypropylene; acetal resins; phenoxy resins; and alkyl resins at one to ten percent weight levels, based on the combined weight of novolak and sensitizer. The plasticizer additives improved the coating properties of the material and enable the application of a film that is smooth and of uniform thickness to the substrate.

Adhesion promoters which may be used include, for example, $\beta$-(3,4-epoxy-cyclohexyl)-ethyltrimethoxysilane; p-methyl-disilane-methyl methacrylate; vinyltrichlorosilane; and $\gamma$-amino-propyl triethoxysilane up to a 4 percent weight level, based on the combined weight of novolak and sensitizer.

Speed enhancers that may be used include, for example, picric acid, nicotinic acid or nitrocinnamic acid at a weight level of up to 20 percent, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

Non-ionic surfactants that may be used include, for example, nonylphenoxy poly(ethyleneoxy) ethanol; octylphenoxy (ethyleneoxy) ethanol; and dinonyl phenoxy poly(ethyleneoxy) ethanol at up to 10 percent weight levels, based on the combined weight of novolak and sensitizer.

SOLUTION STABILITY

Photoresist compositions were prepared according to the method outlined above. The photosensitizer compositions from the examples are dissolved in a prefiltered solution of 24.0% novolak resin and 76% propylene glycol methyl ether acetate (PGMEA). The resist compositions are adjusted to a sensitizer absorptivity of 1.0 1/gm cm at a wavelength of 377 nm. For example, if a 30 mg sample of 2,3,4-trihydroxybenzophenone-1,2-naphthoquinonediazide4-sulfonic acid triester in one liter of acetone has an absorptivity of 0.731 as measured at 377 nm, the resist composition is prepared as follows:
4.1% photosensitizer composition
23.0% novolak resin
72.9% PGMEA As a second example, if a 30 mg sample of a photosensitizer composition in a liter of acetone has a absorptivity of 0.681, the resist composition is prepared as follows:

4.4% photosensitizer composition
22.9% novolak resin
72.7% PGMEA

The thusly prepared photoresist test solutions are filtered through an Ertel grade 8 filter pad, then through a 0.2 to 0.5 μm Fluoropore filter (available from Millipore Corporation). The test solutions are protected from light and stored in a constant temperature air oven at 50° C. for a period of five days and then examined for visible precipitate. If -precipitate is visible in a test solution, the sample has failed the solution stability test. Results from the solution stability test for several modified and unmodified photosensitizer compositions are set forth in Table 1.

TABLE 1

| Photosensitizer Sample | Modification[1] (mole %) | Solution Stability Test Result |
|---|---|---|
| A | none | Fail |
| B | none | Fail |
| C | none | Fail |
| D | 2.5% methanesulfonyl chloride | Pass |
| E | 2.5% methanesulfonyl chloride | Pass |
| F | 5% methanesulfonyl chloride | Pass |
| G | 5% methanesulfonyl chloride | Pass |
| H | 10% methanesulfonyl chloride | Pass |
| I | 10% methanesulfonyl chloride | Pass |
| J | 10% methanesulfonyl chloride | Pass |
| K | 20% methanesulfonyl chloride | |
| L | 20% methanesulfonyl chloride | Pass |
| M | 10% ethanesulfonyl chloride | Pass |
| N | 10% benzenesulfonyl chloride | Pass |
| O | 10% valeryl chloride | Pass |
| P | 10% dichlorobenzoyl chloride | Pass |

[1]The photosensitizer compositions of the test samples were prepared by reacting 2,3,4-trihydroxybenzophenone with a stoichiometric amount of a Diazo/organic acid halide mixture. The figures in this column represent the percentage of organic acid halide in the mixture. In samples where no modification was made, the 2,3,4-trihydroxybenzophenone was condensed with only Diazo.

As the data indicates, the modified photosensitizer compositions have improved solution stability over the unmodified photosensitizers.

Several other phenolic compounds were modified. However, the solution stability testing data are inconclusive because the photosensitizer composition could not be formulated in the stock resin solution described above or both the modified and unmodified compositions failed the test. The data are set forth in Table 2.

TABLE 2

| Photo-sensitizer Sample | Phenolic Compound | Modification (mole %) | Solution Stability Test Result |
|---|---|---|---|
| Q | 1,3,5-trihydroxy benzene | none | Unable to Formulate |
| R | 1,3,5-trihydroxy benzene | 10% methane-sulfonyl chloride | Unable to Formulate |
| S | 2,2',4,4'-tetra-hydroxybenzophenone | none | Fail |
| T | 2,2',4,4'-tetra-hydroxybenxo-phenone | 10% methane-sulfonyl chloride | Fail |

The choice of the solvent system may affect the ability to formulate a particular photosensitizer composition. For example, a photosensitizer may be difficult to formulate in one solvent system, but readily formulated in another. However, where the modified and unmodified photosensitizer compositions can be formulated, the unmodified composition will generally precipitate before the modified composition.

SHELF LIFE

Determining the shelf life at room temperature for a particular sample photoresist composition is both time-consuming and impractical. The solution stability test, as described previously, is preferred for predicting the relative shelf life anticipated for a resist composition prepared from a particular photosensitizer composition. However, real time shelf life tests were done for several sample photoresist compositions. The samples are stored at room temperature and are periodically examined for any visible precipitate. Generally, the unmodified diazo photosensitizer precipitates from solution within six weeks and nearly always before three months. Test data for samples after three months storage are set forth in Table 3.

TABLE 3

| Photosensitizer Sample | Modification[1] (mole %) | Solution Stability[2] Test Result |
|---|---|---|
| B | none | Fail |
| U | none | Fail |
| V | none | Fail |
| F | 5% methanesulfonyl chloride | Pass |
| G | 5% methanesulfonyl chloride | Pass |
| H | 10% methanesulfonyl chloride | Pass |
| I | 10% methanesulfonyl chloride | Pass |
| J | 10% methanesulfonyl chloride | Pass |
| K | 20% methanesulfonyl chloride | Pass |
| L | 20%% methanesulfonyl chloride | Pass |

[1]The photosensitizer compositions of the test samples were prepared by reacting 2,3,4-trihydroxybenzophenone with a stoichiometric amount of a Diazo/organic acid halide mixture. The figures in this column represent the percentage of organic acid halide in the mixture. In samples where no modification was made, the 2,3,4-trihydroxybenzophenone was condensed with only Diazo.
[2]The samples were examined after three months. "Fail" denotes visible precipitation observed, "Pass" denotes no visible precipitation.

The data indicates that relative to the unmodified Diazo photosensitizer, the modified sensitizer compositions of the invention have an enhanced resistance to precipitation and, consequently, photoresist compositions formulated therefrom have longer shelf lifes.

PHOTOSENSITIVITY, CONTRAST AND UNEXPOSED FILM LOSS

The prepared resist solution, can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. Suitable substrates include silicon, aluminum or polymeric resins, silicon dioxide, doped silicon dioxide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters.

After the resist composition solution is coated onto the substrate, the substrate is baked at approximately 80° to 105° C. until substantially all the solvent has evaporated and only a thin coating of photoresist composition on the order of a micron in thickness remains on the substrate. The coated substrate can then be exposed to actinic radiation especially ultraviolet radiation in any desired exposure pattern produced by use of suitable masks, negatives, stencils, templates, etc.

The exposed resist-coated substrates are next substantially immersed in alkaline developing solution. The solution is preferably agitated, for example, by nitrogen burst agitation.

The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The resist compositions of the present invention are resistant to acid-base etching solutions and provide effective protection for the unexposed resist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 2

Resist formulations are prepared with the photosensitizer compositions of this invention and adjusted to a sensitizer absorptivity of 0.76 1/gm-cm ±0.025 at a wavelength of 377 nm. The sensitizer to be tested is dissolved in a pre-filtered stock solution of 24.0% novolak resin and 76% propylene glycol methyl ether acetate. The resist solutions are then filtered through an Ertel grade 8 filter pad.

The photoresist compositions are spin coated on several silicon wafers at a constant, predetermined spin speed to obtain 2.0 $\mu$m layers of dried resist film. The wafers are then baked at 90° C. for 30 minutes.

The initial film thicknesses of the resist coatings are measured by a Rudolf Film Thickness Monitor. The wafers are then exposed to varied amounts of UV light energy (350–450 nm). The resists are developed for 1 minute at 25° C. using AZ 400 K alkali developer, available from American Hoechst Corporation, Somerville, N.J., diluted 1:3 with deionized water. At this developer strength, the dark erosion rate, or development rate of non-exposed resist film, is generally maintained within the range of 0.005 to 0.015 $\mu$m/minute (50 to 150 Å/min.). The remaining film thicknesses are then remeasured by the Rudolf Film Thickness Monitor to determine film loss for the particular energy dose.

Photosensitivity is measured by generating a characteristic curve, as described in Wake, R.W. and Flanigan, M.C., "A Review of Contrast in Positive Photoresists", SPIE Vol. 539, *Advances in Resist Technology and Processing II* (1985), p. 291, which is herein incorporated by reference, wherein film thickness loss after one minute of development is plotted against the logarithm of the UV exposure dose. By interpolation of this plot to 1.0 $\mu$m film loss, the photosensitivity value in mJ/cm$^2$ is obtained. The slope of the linear portion of the plot is the contrast.

The results of photosensitivity, contrast and dark erosion rate testing of several photoresist compositions prepared with photosensitizer compositions of this invention are set forth in Table 4 and compared with photoresists prepared with unmodified photosensitizer compositions. Statistical standards were established by testing three samples of formulated resists containing unmodified 2,3,4-trihydroxybenzophenone-1,2-naphtho-quinonediazide-4-sulfonic acid (Diazo) triester. Each sample w evaluated three times for photosensitivity and contrast, thus generating nine sets of data. The range of deviation in photosensitivity (mJ/cm$^2$) from the mean photospeed was ±10 percent. The absolute difference between the high and low photosensitivity values was 20 percent of the low value. Similarly, the range of deviation in the contrast values from the mean contrast value was ±10 percent and the absolute difference between the high and low contrast value was 24 percent of the low value.

TABLE 4

| Photo-sensitizer Sample | Modification (mole %) | Absorptivity (1/gm-cm @ 377 nm) | Dark Erosion ($\mu$m/min.) | Photosensitivity (% faster (−)[1] or slower (+) of standard) | Contrast (% higher (+) or[2] lower (−) than standard) |
|---|---|---|---|---|---|
| D | 2.5% methane-sulfonyl chloride | 0.762 | 0.007 | +4 | 0 |
| F | 5% methane-sulfonyl chloride | 0.759 | 0.011 | +22 | +15 |
| G | 5% methane-sulfonyl chloride | 0.782 | 0.009 | +13 | +16 |
| H | 10% methane-sulfonyl chloride | 0.758 | 0.006 | −3 | +3 |
| I | 10% methane-sulfonyl chloride | 0.752 | 0.003 | +8 | −3 |
| J | 10% methane-sulfonyl chloride | 0.778 | 0.001 | +6 | −2 |
| K | 20% methane-sulfonyl chloride | 0.775 | 0.005 | +43 | +23 |

TABLE 4-continued

| Photo-sensitizer Sample | Modification (mole %) | Absorptivity (1/gm-cm @ 377 nm) | Dark Erosion (μm/min.) | Photosensitivity (% faster (−)[1] or slower (+) of standard) | Contrast (% higher (+) or[2] lower (−) than standard) |
|---|---|---|---|---|---|
| L | 20% methane-sulfonyl chloride | 0.770 | 0.006 | +54 | +18 |
| M | 10% ethane-sulfonyl chloride | 0.756 | 0.011 | +16 | +12 |
| N | 10% benzene-sulfonyl chloride | 0.775 | 0.007 | +39 | +6 |
| O | 10% valeryl-sulfonyl chloride | 0.770 | 0.010 | +29 | −17 |
| P | 10% dichlorobenzoyl-sulfonyl chloride | 0.767 | 0.008 | +38 | −15 |

[1]Typical photosensitivity of standard 2,3,4-trihydroxybenzophenone-1,2-naphthoquinonediazide-4-sulfonic acid triester
@ 350–450 nm broadband exposure measured at 405 nm = 18.9 mJ/cm$^2$
@ 365 nm narrowband exposure measured at 365 nm 20.6 mJ/cm$^2$
[2]Typical contrast values of standard 2,3,4-trihydroxybenzophenone-1,2-naphthoquinonediaxide-4-sulfonic acid triester
@ 350–450 nm broadband exposure measured at 405 nm = 3.09
@ 365 nm narrowband exposure measured at 365 nm = 2.43

The results of Table 4 show that the photoresist compositions of the invention have lithographic properties comparable to the unmodified analogous compositions.

What is claimed is:

1. A photosensitive article comprising a substrate and a photosensitive composition on the substrate, the photosensitive composition comprising a photosensitive compound prepared by: condensing a phenolic compound represented by the general formulae (A), (B) or (C):

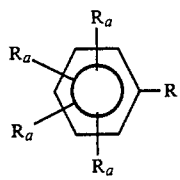 (A)

wherein R is H, —X—R$_b$, or

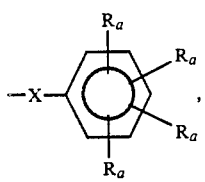,

R$_a$ is H, —OH, halogen or lower alkyl, with at least two and not greater than six R$_a$ radicals being —OH, X is a single C—C bond, —O—, —S—, —SO$_s$—,

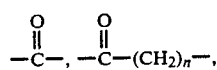

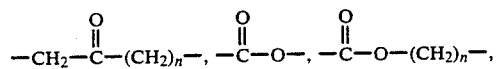

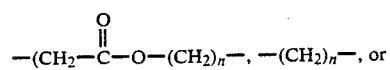

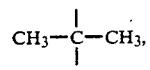

n is 1 or 2, R$_b$ is H, alkyl, aryl, substituted alkyl or substituted aryl;

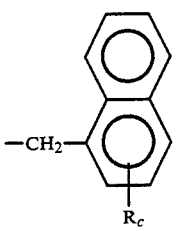 (B)

wherein R$_1$ is H or

,

R$_c$ is H or —OH with at least two R$_c$ radicals being —OH; and

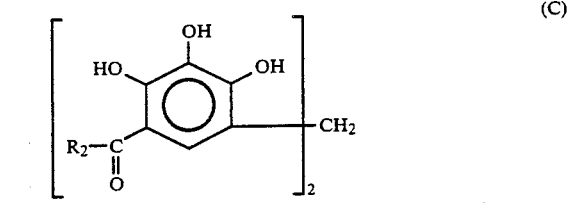 (C)

wherein R$_2$ is H, alkyl, aryl, substituted alkyl or substituted aryl; with a 1,2-naphthoquinonediaxide-4-sulfonic acid (Diazo) and with an organic acid halide represented by the formula W-R3, wherein W is $$-\overset{O}{\underset{\|}{C}}-V$$

or —SO$_2$—V, V is halogen, R3 is alkyl, aryl substituted alkyl or substituted aryl; wherein the molar ratio of the amount of Diazo to the amount of organic acid halide to be reacted is in the range of from about 1:1 to about 39:1.

2. The article of claims 1 wherein the substrate comprises a material selected from the group consisting of silicon, aluminum, or polymeric resins, silicon dioxide, doped silicon dioxide, silicon nitrite, tantalum, copper, polysilicon, ceramics and aluminum/copper mixtures.

3. The article of claim 1, wherein the ratio of the amount of Diazo reacted to the amount of organic acid halide reacted is in the range of from about 4:1 to about 19:1.

4. The article of claim 1, wherein the ratio of the amount of Diazo reacted to the amount of organic acid halide reacted is in the range of from about 93:7 to about 85:15.

5. The article of claim 1, wherein the phenolic compound is a dihydroxybenzophenone, a trihydroxybenzophenone or a tetrahydroxybenzophenone; and the organic acid halide is a lower alkyl sulfonyl halide, a benzene sulfonyl halide, a lower alkyl acyl halide or a benzoyl halide.

6. The article of claim 1, wherein the phenolic compound is 2,3,4-trihydroxybenzophenone.

7. The article of claim 1 wherein the photosensitive composition further comprises an aqueous alkali soluble binder resin.

8. The article of claim 7 wherein the resin comprises a novolak or polyvinyl phenol resin.

9. The article of claim 1 wherein the photosensitive composition further, comprises a solvent.

10. The article of claim 9 wherein the solvent comprises propylene glycol methyl ether acetate.

11. The article of claim 1 wherein the organic acid halide is selected from the group consisting of alkyl sulfonyl halides, arylsulfonyl chlorides, and acyl halides.

12. The article of claim 1 wherein the organic acid halide is selected from the group consisting of methanesulfonyl chloride, ethanesulfonyl chloride, propanesulfonyl chloride, n-butanesulfonyl chloride, dodencanesulfonyl chloride, benzenesulfonyl chloride, naphthalenesulfonyl chlorides, acetyl chloride, butanoyl chloride, valeryl chloride, benzoyl chloride, benzoyl bromide, and naphthoyl chlorides.

13. The article of claim 1 wherein the photosensitive composition further comprises a solvent selected from the group consisting of glycol ethers, cellosolve acetatese, esters, ketones and aromatic hydrocarbons.

14. The article of claim 1 wherein the photosensitive composition further comprises one or more of colorants, dyes, anti-striation agents, plasticizers, adhesion promoters, speed enhancers and surfactants.

15. The article of claim 1 wherein the photosensitive composition further comprises a plasticizer selected from the group consisting of phosphoric acid tri-(beta-chloroethyl)-ester; stearic acid; dicamphor; polypropylene; acetal resins; phenoxy resins; and alkyl resins.

16. The article of claim 1 wherein the photosensitive composition further comprises an adhesion promoter selected from the group consisting of beta-(3,4, -epoxycyclohexyl)-ethyltrimethoxysilane; p-methyl-disilanemethyl methacrylate; vinyltrichlorosilane; and gamma-amino-propyltriethoxysilane.

17. The article of claim 1 wherein the photosensitive composition further comprises a speed enhancer selected from the group consisting of picric acid, nicotinic acid or nitrocinnamic acid.

18. The article of claim 1 wherein the photosensitive composition further comprises a non-ionic surfactant selected from the group consisting of nonylphenoxy poly(ethyleneoxy)ethanol; octylphenoxy(ethyleneoxy)ethanol; and dinonylphenoxy poly(ethyleneoxy)ethanol.

* * * * *